US012644948B2

(12) United States Patent
Hennequin et al.

(10) Patent No.: US 12,644,948 B2
(45) Date of Patent: Jun. 2, 2026

(54) METHOD AND SYSTEM FOR CALIBRATING VOLTAGE MEASUREMENTS IN A SYSTEM FOR MEASURING ELECTRICAL QUANTITIES

(71) Applicant: Schneider Electric Industries SAS, Rueil Malmaison (FR)

(72) Inventors: Michel Hennequin, Crolles (FR); Stéphane Sicard, La Mure (FR); Roland Bohrer, La Sure en Chartreuse (FR); Jonathan Caillou, La Buisse (FR); Benoît Leprettre, La Tronche (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 169 days.

(21) Appl. No.: 18/428,044

(22) Filed: Jan. 31, 2024

(65) Prior Publication Data

US 2024/0272260 A1     Aug. 15, 2024

(51) Int. Cl.
*G01R 35/00*          (2006.01)
*G01R 15/16*          (2006.01)
(Continued)

(52) U.S. Cl.
CPC ........... *G01R 35/005* (2013.01); *G01R 15/16* (2013.01); *G01R 19/175* (2013.01); *G01R 25/005* (2013.01); *G06F 13/38* (2013.01)

(58) Field of Classification Search
CPC .... G01R 35/005; G01R 15/16; G01R 19/175; G01R 25/005; G01R 21/06; G01R 21/133;
(Continued)

(56) References Cited

U.S. PATENT DOCUMENTS

2009/0243628 A1 * 10/2009 Andarawis ............. H03D 13/00
                                                                  324/76.77
2011/0228437 A1 * 9/2011 Kinoshita .............. H01H 9/563
                                                                  361/115
(Continued)

FOREIGN PATENT DOCUMENTS

EP          3671231 A1      6/2020
NL          2016237 B1      8/2017

OTHER PUBLICATIONS

French Search Report and Written Opinion dated Aug. 31, 2023 for corresponding French Patent Application No. FR2301318, 9 pages.

*Primary Examiner* — Akm Zakaria
(74) *Attorney, Agent, or Firm* — Kinney & Lange, P.A.

(57)          ABSTRACT

A system for calibrating voltage measurements in a system for measuring electrical quantities includes a calibration device configured to determine a first reference time instant of a zero-crossing event of a voltage signal that it measures, and transmit a calibration message including the first reference time instant and a measured voltage amplitude value to at least one device for measuring electrical quantities. The at least one device for measuring electrical quantities is configured to receive the calibration message, extract the first reference time instant and the voltage amplitude, determine a second reference time instant, of zero crossing of the voltage signal measured locally, corresponding to the first reference instant, calculate a phase shift of the locally-measured voltage signal, as a function of the difference between the first and the second reference time instants and apply a phase and amplitude voltage calibration as a function of the voltage amplitude and of the phase shift.

10 Claims, 4 Drawing Sheets

(51) Int. Cl.
  *G01R 19/175* (2006.01)
  *G01R 25/00* (2006.01)
  *G06F 13/38* (2006.01)
(58) Field of Classification Search
  CPC .. G01R 22/063; G01R 19/2513; G01R 19/00;
      G01R 35/007; G01R 31/31726; G01R
      31/31727; G06F 13/38; H04L 67/1095
  See application file for complete search history.

(56) References Cited

U.S. PATENT DOCUMENTS

| | | | |
|---|---|---|---|
| 2013/0069627 A1* | 3/2013 | Cs ..................... | G01R 19/2513 |
| | | | 324/76.77 |
| 2013/0211751 A1* | 8/2013 | Park ...................... | G01R 21/06 |
| | | | 702/61 |
| 2015/0369848 A1 | 12/2015 | Shamir | |
| 2017/0184697 A1* | 6/2017 | Kostrba .............. | G01R 35/005 |
| 2020/0200802 A1 | 6/2020 | Guibert et al. | |
| 2023/0184818 A1* | 6/2023 | Triomphe ............. | G08C 17/02 |
| | | | 702/62 |
| 2024/0056285 A1* | 2/2024 | Tousi ..................... | H04L 7/033 |

* cited by examiner

METHOD AND SYSTEM FOR CALIBRATING VOLTAGE MEASUREMENTS IN A SYSTEM FOR MEASURING ELECTRICAL QUANTITIES

TECHNICAL FIELD

The present invention relates to a method and a system for calibrating voltage measurements in a system for measuring electrical quantities.

The invention lies in the field of measuring and calculating electrical quantities in a distributed manner, in an electrical apparatus.

BACKGROUND

Specifically, in electrical apparatuses, for example local power distribution networks, it is useful to measure electrical quantities, in particular electric current and voltage, on various electrical conductors, in several locations in the network, and to calculate other electrical quantities, e.g. power, energy etc.

For example, devices for measuring electrical quantities, e.g. current or voltage sensors, are known which have communication interfaces, for example for communicating the measured electrical quantities, which makes it possible to implement a network for communication between measurement devices and a gateway communication device, which makes it easier for users to supervise and control the electrical network.

In addition, other electrical quantities may advantageously be calculated on the basis of the current and voltage values measured by such sensors in such a communication network.

In particular, the invention applies in the case of a distributed system for measuring electrical quantities comprising a plurality of devices for measuring electrical quantities which are equipped with modules for measuring voltage by means of capacitive coupling. In such a system, measuring voltage by means of capacitive coupling, without being connected directly to the electrical conductor concerned, is liable to introduce a time delay. Now, the AC electrical signals travelling through an electrical apparatus are each characterized by an amplitude and a phase. A time delay results in a phase shift or phase difference in the voltage measurements. In a distributed system for measuring electrical quantities, since the electrical quantities are calculated for AC current and voltage signals, it is important to synchronize the various measurements temporally in order to obtain accurate calculations of electrical quantities, such as, for example, power. To this end, it is important to calibrate the measurements obtained by the various devices for measuring electrical quantities located in various places in the electrical apparatus, the calibration relating to the amplitude and/or the phase of the measured electrical signals.

SUMMARY

The objective of the invention is to propose a solution for calibrating the voltage measurements in such a distributed system for measuring electrical quantities.

To this end, the invention proposes, according to one aspect, a system for calibrating voltage measurements in a system for measuring electrical quantities by means of a plurality of devices for measuring electrical quantities which are distributed in an electrical apparatus, each device for measuring electrical quantities comprising
  a module for measuring voltage by means of capacitive coupling,
  a communication interface configured to communicate according to a communication protocol,
  a local clock which makes it possible to date events in a local temporal reference frame,
the system further comprising a single calibration device, configured to measure a voltage signal by means of contact with one or each electrical conductor of the electrical apparatus, the calibration device comprising a communication interface configured to communicate according to said communication protocol and a local clock.

This system further comprises a synchronization device comprising a clock referred to as the synchronization clock, which makes it possible to date an event in a reference temporal reference frame, the said devices for measuring electrical quantities and the calibration device each being configured to communicate with the synchronization device and to implement a mechanism for synchronizing the local clock with the synchronization clock, which makes it possible to date an event in said reference temporal reference frame. The calibration device is configured to:
  determine a first reference time instant, in the reference temporal reference frame, of a zero-crossing event of said voltage signal measured by the calibration device,
  transmit a calibration message comprising said first reference time instant and a measured voltage amplitude value to at least one device for measuring electrical quantities, and
said at least one device for measuring electrical quantities is configured to:
  receive said calibration message from the calibration device, and extract said first reference time instant and the voltage amplitude,
  determine a second time instant, of zero crossing of the voltage signal measured locally, in the reference temporal reference frame, referred to as the second reference time instant, corresponding to said first reference instant,
  calculate a phase shift of the locally-measured voltage signal, as a function of the difference between the first reference time instant and the second reference time instant, and
  apply a phase and amplitude voltage calibration as a function of the received voltage amplitude and of the calculated phase shift.

Advantageously, the proposed calibration system makes it possible to calculate the phase difference for each device for measuring electrical quantities.

The system for calibrating distributed voltage measurements according to the invention may have one or more of the features below, taken independently or in any acceptable combination.

The device for measuring electrical quantities is configured to store a plurality of second time instants, which are expressed in the reference frame, of zero crossing of the voltage signal measured locally.

In order to determine the second reference time instant, said device for measuring electrical quantities is configured to determine, from among the stored second time instants, the second time instant of zero crossing which is closest to said first reference time instant.

The calibration device is configured to broadcast said calibration message to all devices for measuring electrical quantities.

The communication protocol is the Zigbee Green Power protocol.

The synchronization device is configured to send synchronization messages successively to at least one communicating device from among the devices for measuring electrical quantities and said calibration device, the successive synchronization messages comprising at least a current synchronization message and a preceding synchronization message, the current synchronization message containing an incremental synchronization message identifier and a time instant at which the preceding synchronization message is sent, each communicating device which receives said synchronization messages being configured to store a local synchronization table, storing items of information relating to time instants, in the local temporal reference frame, at which messages are received from the synchronization device and the time instants at which said synchronization messages are sent, in the reference temporal reference frame, by the synchronization device.

Each communicating device is configured to calculate a correspondence between the local clock of said communicating device and the reference clock using the local synchronization table.

The synchronization device is a gateway communication device, comprising a communication interface configured to communicate according to said communication protocol.

According to another aspect, the invention relates to a method for calibrating voltage measurements which is implemented in a calibration system as described above, comprising steps of:

by means of the calibration device:

determining a first reference time instant, in the reference temporal reference frame, of a zero-crossing event of said voltage signal measured by the calibration device, transmitting a calibration message comprising said first reference time instant and a measured voltage amplitude value to at least one device for measuring electrical quantities, by means of at least one device for measuring electrical quantities:

receiving said calibration message from the calibration device, and extracting said first reference time instant and the voltage amplitude, determining a second time instant, of zero crossing of the voltage signal measured locally, in the reference temporal reference frame, referred to as the second reference time instant, corresponding to said first reference instant, calculating a phase shift of the locally-measured voltage signal, as a function of the difference between the first reference time instant and the second reference time instant, and applying a phase and amplitude voltage calibration as a function of the received voltage amplitude and of the calculated phase shift.

This method has the same advantages as those of the calibration system.

The method for calibrating distributed voltage measurements according to the invention may have one or more of the features below, taken independently or in any acceptable combination. The synchronization mechanism comprises, by means of the synchronization device, sending successive synchronization messages to at least one communicating device from among the devices for measuring electrical quantities and the calibration device, the successive messages comprising at least a current synchronization message and a preceding synchronization message, the current synchronization message comprising an incremental synchronization message identifier and a time instant at which the preceding message is sent.

The calibration and synchronization messages are sent by said synchronization device, grouped into calibration and synchronization messages, to said devices for measuring electrical quantities.

BRIEF DESCRIPTION OF THE DRAWINGS

Other features and advantages of the invention will emerge from the description which is given thereof below by way of indicative and non-limiting example, with reference to the appended figures, among which.

DETAILED DESCRIPTION

Figure 1:
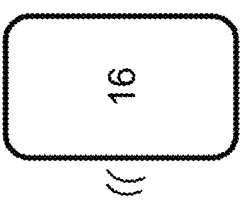
FIG. 1 schematically shows a distributed system for measuring electrical quantities in an electrical apparatus.

The invention notably applies to a system for measuring electrical quantities in an electrical apparatus as described in FIG. 1.

It should be noted that the invention applies more generally to calibrating voltage measurements in an electrical apparatus, which are supplied by a plurality of measuring devices which are equipped with modules for measuring voltage by means of capacitive coupling, inducing a measurement lag which results in a phase difference.

FIG. 1 schematically illustrates a system for measuring electrical quantities 2, the measurements being carried out in a distributed manner, in an electrical apparatus.

The electrical apparatus, which is not shown in FIG. 1, is, for example, a domestic power distribution apparatus or a power distribution apparatus for a commercial, industrial or services building, configured to supply electrical energy and loads which consume electrical energy (which are not shown), which are connected by means of electrical conductors 8, from one or more sources of electrical energy, notably comprising a public power distribution network supplying an alternating current, and, optionally, local sources, e.g. photovoltaic panels.

The electrical conductors 8 are, for example, conducting cables or bars made of electrically conductive material.

The electrical apparatus may be a single-phase or polyphase apparatus, comprising a number N of phases of electric current, with or without a neutral conductor.

In the schematic representation of FIG. 1, the system 2 for measuring electrical quantities comprises a plurality of devices 4 for measuring electrical quantities, for example up to 40 measurement devices.

Each device 4 for measuring electrical quantities is connected, in the illustrated example, to an electrical protection unit 6, for example a circuit breaker, by means of electrical conductors 8.

For example, in one embodiment, all of the circuit breakers 6 and of the devices 4 for measuring electrical quantities are placed in an electric switchboard or in an electrical enclosure.

As a variant, each device 4 for measuring electrical quantities is connected to a point of the electrical network to be monitored, without being connected to an electrical protection unit.

Each device 4 is equipped with a wireless communication interface. In other words, each device 4 is a communicating device, configured to communicate, according to a chosen wireless protocol, with the other communicating devices of the system 2 for calculating electrical quantities, thus forming a local communication network of smart objects.

For example, the implemented wireless communication protocol is the Bluetooth® protocol, or the Zigbee Green Power® protocol.

As described in more detail below, each device 4 is configured to measure electrical quantities characterizing the electrical signal which travels through the or through each electrical conductor 8 of the electrical apparatus to be monitored.

In particular, each device 4 is configured to supply voltage measurements by means of capacitive coupling, i.e. without contact with the electrical conductor 8.

Thus, each device 4 is a device for measuring voltage by means of capacitive coupling.

In one embodiment, each device 4 is, furthermore, configured to supply measurements of electric current continuously on the or each of the electrical conductors 8 to which it is connected. In other words, in this embodiment, each device 4 is configured to measure current and voltage.

In addition, each device 4 comprises a programmable electronic circuit, e.g. a processor, a microprocessor, an electronic circuit formed of programmable logic components, such as FPGAs (field-programmable gate arrays), or indeed dedicated integrated circuits, such as ASICs (application-specific integrated circuits), which is configured to calculate chosen electrical quantities.

The system 2 further comprises, in one embodiment, a single device 10 for measuring voltage, called a calibration device, configured to measure voltage by means of contact, equipped with a communication interface, so as to make it possible to broadcast the continuously-performed voltage measurements to the devices 4 for measuring electrical quantities, which makes it possible to improve the accuracy of the voltage measurements in the system.

The system 2 further comprises, in this embodiment, a gateway communication device 12, comprising a communication interface 14 configured to communicate according to the communication protocol used by the devices 4, so as to communicate bidirectionally with these devices 4.

Furthermore, the gateway communication device 12 is configured to communicate, for example according to the same or another wireless communication protocol, with one or more user devices 16. For example, this other wireless communication protocol is the Wi-Fi or Bluetooth® protocol.

According to one variant, wired communication is used, for example using the Ethernet or Modbus protocol.

Thus, a user, for example a maintenance operator, is capable of receiving, via the user device 16, obtained measurements of electrical quantities, making it possible to supervise, monitor the correct operation of, and plan the predictive maintenance of, the electrical apparatus concerned.

The supplied measurements are, for example, displayed on a human-machine interface of the user device 16.

The devices 4 for measuring electrical quantities have similar structures; a device 4 for measuring electrical quantities is described in more detail with reference to FIG. 1, it being understood that the other devices 4 are similar.

The device 4 comprises a communication interface 20 configured to communicate according to the chosen communication protocol with the other devices 4 and with the gateway communication device 12.

The device 4 comprises a module 22 for measuring voltage by means of capacitive coupling.

Several arrangements of such a capacitive-coupling voltage module are conceivable and within reach of a person skilled in the art.

Thus, the device 4 is a device for measuring voltage configured to measure voltage by means of capacitive coupling.

In addition, the device 4 comprises a computing processor 24 and an associated clock 26, referred to as the local clock. Dating an event using the local clock of the device 4 is called dating in the local temporal reference frame.

Thus, each device 4 has an associated local temporal reference frame.

The calibration device 10 comprises a communication interface 30 configured to communicate according to the wireless communication protocol with the other devices 4 and with the gateway communication device 12 and a module 32 for measuring voltage which is connected to the corresponding electrical conductor 8. Advantageously, the module 32 for measuring voltage supplies a voltage measurement which is accurate in terms of amplitude and in terms of phase.

The calibration device 10 further comprises a computing microprocessor 34, or another type of processor, an electronic circuit formed of programmable logic components, such as FPGAs (field-programmable gate arrays), or indeed dedicated integrated circuits, such as ASICs (application-specific integrated circuits), and an associated local clock 36, which makes dating in a temporal reference frame referred to as the calibration temporal reference frame possible.

The gateway communication device 12 also comprises a computing processor 38 and a clock 40, which is an internal clock of this device, for example associated with the computing processor 38.

One of the communicating devices 4, 10, 12 is selected to fulfil the function of synchronization device, which supplies a common temporal reference frame, referred to as the reference temporal reference frame.

In other words, the synchronization device is the master temporal synchronization device, and the other communicating devices of the network are slave devices.

In one embodiment, the gateway communication device 12 is chosen as the synchronization device, the clock of this device then being referred to as the synchronization clock and the temporal reference frame of the gateway communication device 12 then being the synchronization temporal reference frame.

Advantageously, the gateway communication device 12 is configured to communicate with all the other communicating devices of the system. In particular, when the communication protocol used is the Zigbee Green Power protocol, all communications between communicating devices pass through the gateway communication device; therefore, it is advantageous to select the gateway device 12 as the synchronization device.

As a variant, when the communication protocol is a communication protocol other than the Zigbee Green Power protocol, for example the Bluetooth protocol or the Zigbee Pro protocol, another of the communicating devices, for example the calibration device 10 or one of the devices for measuring electrical quantities 4, is chosen as the synchronization device.

A synchronization mechanism is implemented by the synchronization device and the other communicating devices of the system, making it possible for each communicating device to date events in the reference temporal reference frame.

The communicating devices are adapted to receive synchronization messages from the synchronization device, containing an item of information, referred to as the item of synchronization information, relating to the synchronization clock. By virtue of this communication, received by each of the communicating devices calculates the time shift between its local clock and the synchronization clock and, consequently, for each local time instant, a corresponding reference time instant.

For example, each synchronization message contains an identifier number and an item of time information, as explained in more detail below.

In one embodiment, the synchronization message is broadcast at the same time to all the communicating devices of the network. Thus, the receiver communicating devices receive the synchronization message.

In another embodiment, in particular when the communication protocol is the Zigbee Green Power protocol, the synchronization message is sent to each communicating device in response to a message from the communicating device to the gateway communication device.

The synchronization mechanism corrects for shift and drift between the local clock and the synchronization clock and makes it possible for each communicating device to date an event in the reference temporal reference frame.

One embodiment of the synchronization mechanism will be described below with reference to FIG. 3.

The voltage measurements are then calibrated in this system 2, in order to make amplitude and phase calibration possible, the voltage signal being an AC signal.

The calibration device 10, which carries out accurate measurements, is configured to broadcast, in broadcast messages or in messages intended for each device 4, on the one hand the measured voltage amplitude and on the other hand a time instant of zero crossing of the voltage signal measured by the calibration device, the time instant being expressed in the reference temporal reference frame. These messages intended for calibration are sent regularly, at a given rate, for example every 5 seconds, and more generally at a rate of between 1 second and 30 seconds.

More specifically, the calibration device 10 is configured to, during each zero-crossing event Ei of the measured voltage signal: determine a first reference time instant T-ref$_{i,1}$, in the reference temporal reference frame, of the zero-crossing event Ei of the measured voltage signal, and transmit a calibration message comprising the first reference time instant T-ref$_{i,1}$ and a measured voltage amplitude value to at least one device 4 for measuring voltage by means of capacitive coupling.

Each device 4 is configured to determine time instants, of zero crossing of the voltage signal measured locally, in the local temporal reference frame, then in the reference temporal reference frame, and to:

receive the calibration message from the calibration device, and extract said first reference time instant and the voltage amplitude, determine a second time instant, of zero crossing of the voltage signal measured locally, in the reference temporal reference frame, referred to as the reference time instant, corresponding to the first reference instant, calculate a phase shift of the locally-measured voltage signal, as a function of the difference between the first reference time instant and the second reference time instant, and apply a phase and amplitude voltage calibration as a function of the received voltage amplitude and of the calculated phase shift.

In one embodiment, in order to determine the second time instant corresponding to the first time instant, i, a search is carried out among time instants, in the reference temporal reference frame, of zero crossing of the voltage signal measured locally, for example in a window of +/−1 ms, and it is the time instant which is closest to the received first time instant which is selected.

The estimated phase shift is a time shift between the first and the second reference time instants corresponding to the same zero-crossing event of the voltage measurement.

Figure 2:
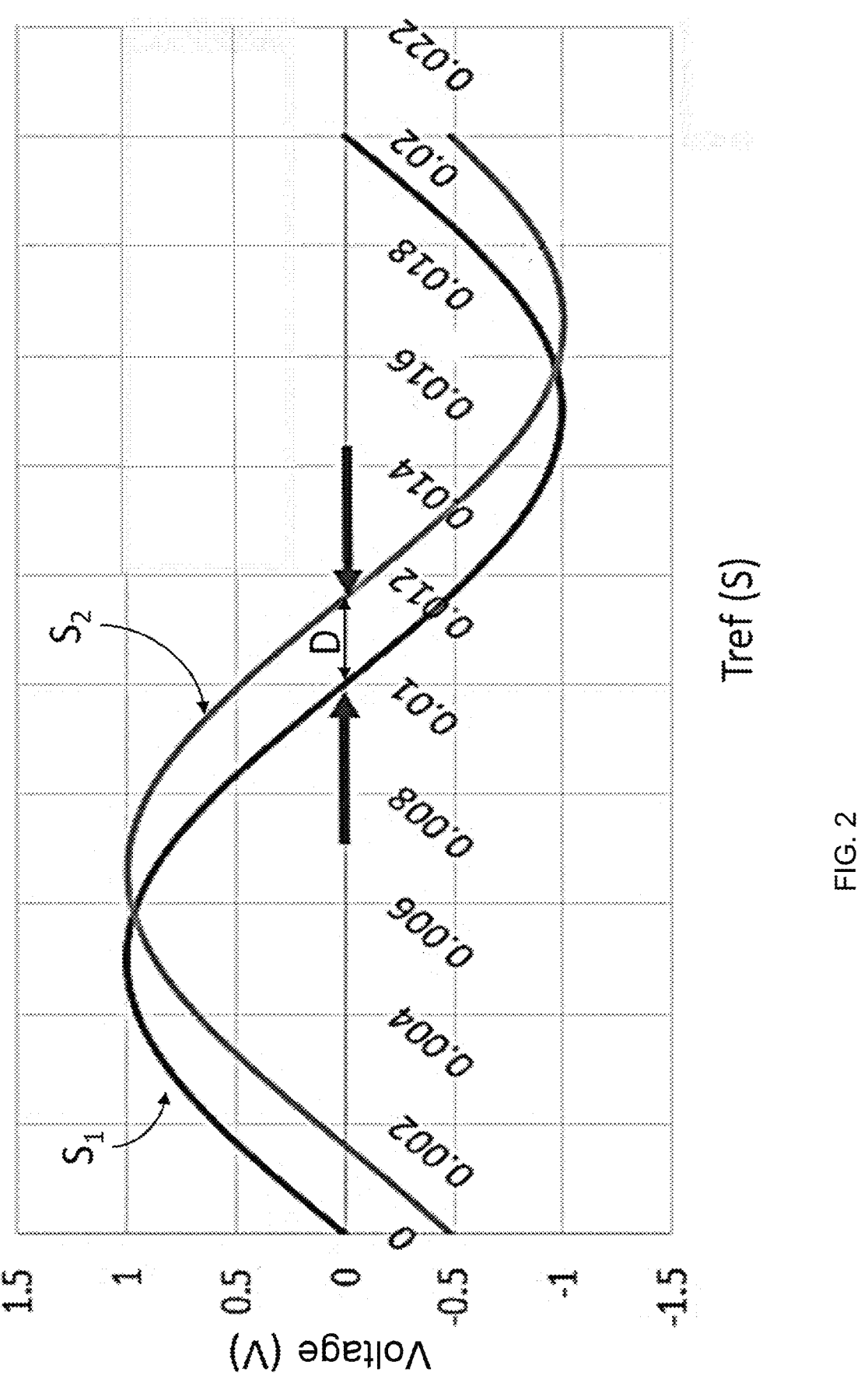
FIG. 2 is a graph illustrating two curves, which are representative of voltage signals, and the phase shift between these two curves.

FIG. 2 graphically illustrates two curves S$_1$ and S$_2$ in a graph showing voltage (on the y-axis) as a function of time in the reference temporal reference frame (on the x-axis), the curve S$_1$ showing the voltage measurement by the calibration device 10 and the curve S$_2$ showing the voltage measurement by a voltage module of a measuring device 4.

The shift D is visible on this graph.

Figure 3:
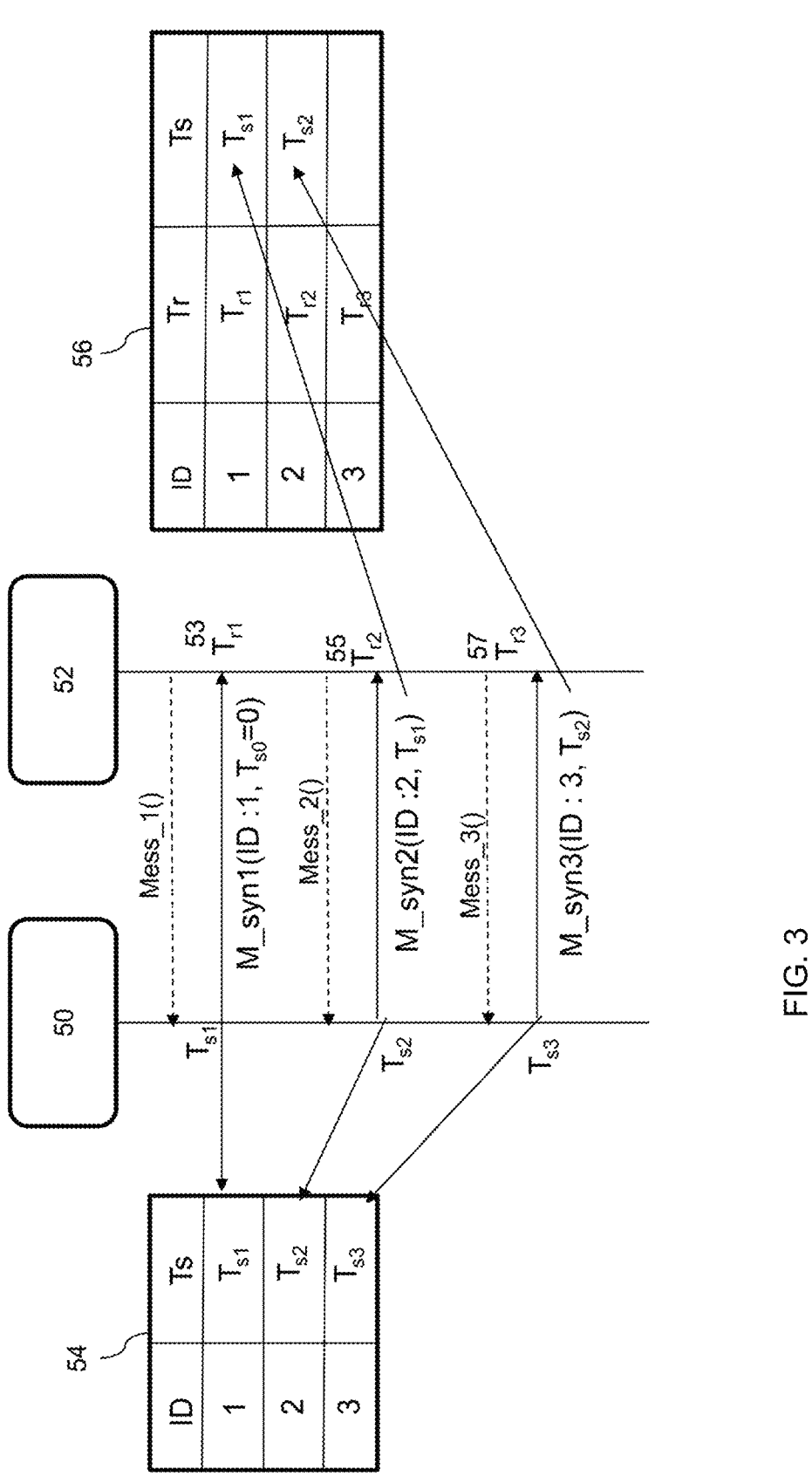
FIG. 3 schematically shows a method for synchronizing a communicating device and the synchronization device in one embodiment.

With reference to FIG. 3, a synchronization method is described in the case where the communication protocol used by the communicating devices 4, 10 and 12 is the Zigbee Green Power protocol.

In this embodiment, the synchronization device is the gateway communication device 12.

A particularity of this communication protocol is that the communications with the gateway communication device 12 must be initiated by the other communicating devices of the communication network.

FIG. 3 schematically illustrates the mechanism for synchronizing the synchronization device 50 (e.g. the gateway communication device 12) and one of the communicating devices, labelled 52 in FIG. 3, which may be one of the devices 4 or the device 10.

The synchronization device 50 maintains a temporal synchronization table 54 for each communicating device 52, stored in an electronic memory of the synchronization device 50.

The communicating device 52 also maintains, in an electronic memory, a local temporal synchronization table 56.

The example of FIG. 2 illustrates 3 successive communications labelled 53, 55, 57, respectively.

In this embodiment, the communicating device 52 successively sends messages Mess_1, Mess_2, Mess_3, which are free of content, to the synchronization device 50.

The synchronization device successively sends, in response to the messages Mess_1, Mess_2, Mess_3 or at regular intervals, synchronization messages M-syn1, M-syn2, Mess-syn3.

Each synchronization message contains an incremental identification number, for example incremented by 1 on each dispatch starting from ID=1 in this example, and an item of time information, which is the instant at which a preceding synchronization message is sent to the communicating device 52.

On initialization, the instant at which the preceding message is sent is initialized to a predetermined value, for example to 0.

The synchronization device 50 stores, in the temporal synchronization table 54, the time instants at which the synchronization messages are sent and the associated incremental identifiers. The sending time instants are expressed in the reference temporal reference frame.

The communicating device 52 receives, at reception time instants, in the local temporal reference frame, denoted Tri, the synchronization messages from the synchronization device 50.

The communicating device 52 stores the items of message identifier information and the reception time instant Tri in the local temporal synchronization table 56, as well as the time instants at which the preceding message is sent which are received from the synchronization device.

The mechanism is repeated in a similar manner during several successive communication steps 53, 55, 57, which makes it possible to store several items of time information relating to time instants at which synchronization messages are sent, in the reference temporal reference frame $T_{s1}$, $T_{s2}$, $T_{s3}$, in the local temporal synchronization table 56.

It is possible to obtain the corresponding time instant $T_{ref-k}$ in the reference temporal reference frame for a time instant $T_{l-k}$ in the local temporal reference frame, from the local temporal synchronization table 56, it is possible to obtain the corresponding time instant $T_{ref-k}$ in the reference temporal reference frame.

Of course, the method explained with reference to FIG. 3 for a communicating device is applied for each of the communicating devices, i.e. for the calibration device 10 and for each of the devices 4 for measuring electrical quantities.

It should be noted that, in other embodiments, for example when a communication protocol other than the Zigbee Green Power protocol is used, the messages Mess_1, Mess_2, Mess_3 are not sent.

The synchronization device transmits, at regular time intervals, synchronization messages comprising an incremental identifier and a sending time instant, as explained above. These synchronization messages are used, in a manner which is similar to what is described above, by each communicating device, to obtain a correspondence between the local clock of the communicating device and the reference clock.

Figure 4:
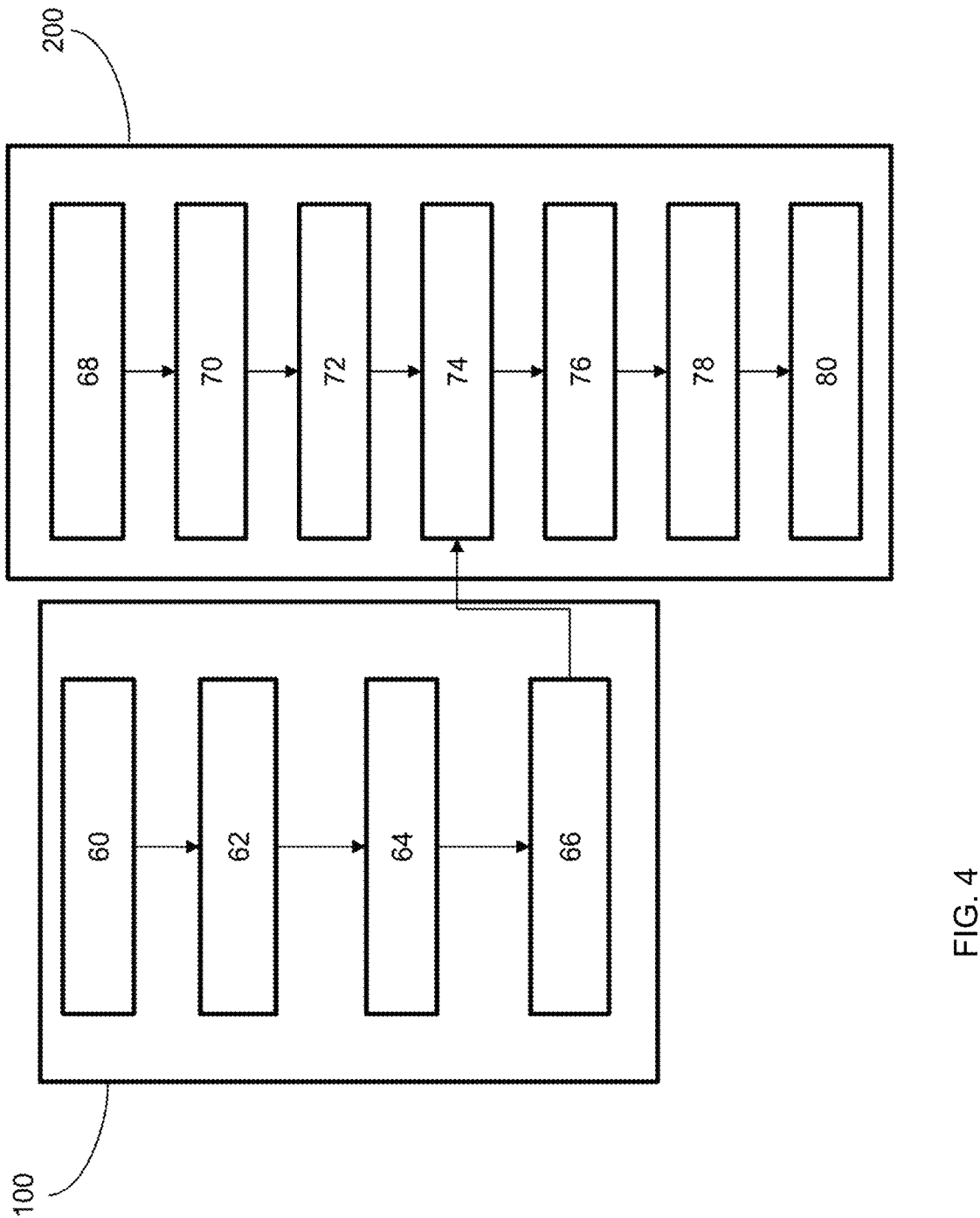
FIG. 4 shows the main steps of a calibration method according to one embodiment.

FIG. 4 is a flowchart of the main steps of one embodiment of the method for calibrating voltage measurements, comprising a set of steps 100 which are implemented by the processor of the calibration device and a set of steps 200 which are implemented by the processor of a device for measuring electrical quantities, respectively.

The method comprises, for an AC voltage signal, a step 60 of detecting a zero-crossing event Ek, implemented by the calibration device 10, and dating (step 62) in the local temporal reference frame of the calibration device, denoted $Tm_k$.

In some embodiments, the detection 60 and the dating 62 are carried out in a single step.

The method further comprises, by means of the calibration device, a step 64 of determining a first reference time instant T-ref$_{k,1}$, in the reference temporal reference frame, corresponding to the calibration time instant $Tm_k$, using the synchronization mechanism described above.

The method further comprises transmitting 66 a calibration message comprising the first reference time instant T-ref$_{k,1}$ and a measured voltage amplitude value by means of the calibration device to at least one device for measuring electrical quantities.

The measured voltage amplitude value is, for example, a root-mean-square (RMS) value of the measured AC voltage.

The device 4 for measuring electrical quantities implements a step 68 of detecting one or more zero-crossing events Ej of the locally-measured voltage signal, of dating the one or more zero-crossing events in the local temporal reference frame (step 70), then of calculating corresponding time instants of zero crossing, referred to as the second time instants, in the reference temporal reference frame (step 72) by implementing the synchronization mechanism.

In one embodiment, several successive time instants $T_j$ of zero crossing of the voltage signal measured locally are stored in the step 72 also.

The device 4 receives, during a reception step 74, the calibration message and extracts therefrom the first reference time instant calculated by the calibration device 10 and the transmitted voltage amplitude.

Then, the device 4 implements a step 76 of determining a second time instant of zero crossing of the voltage signal measured locally, in the reference temporal reference frame, referred to as the second reference time instant T-ref$_{k,2}$, corresponding to said first reference instant T-ref$_{k,1}$.

In one embodiment, the second reference time instant T-ref$_{k,2}$ is the time instant of zero crossing which is closest, from among the stored time instants $T_j$, to the first reference time instant T-ref$_{k,1}$. For example, the second reference time instant T-ref$_{k,2}$ is shifted by less than one millisecond from the first reference time instant T-ref$_{k,1}$.

The method further comprises a step 78 of calculating the phase shift D, as a function of the difference between the first reference time instant T-ref$_{k,1}$ and the second reference time instant T-ref$_{k,2}$.

The calculated phase shift D is then applied in the calibration step 80 in order to calibrate, i.e. temporally readjust, the voltage measurements with respect to current measurements also obtained, which then makes it possible to calculate powers accurately.

The voltage amplitude received in the calibration message is also used in the calibration step 80 to calibrate the amplitude of the locally-measured voltage signal.

The steps described above are repeated at regular time intervals, for example every 1 to 30 seconds, for example every 5 seconds.

In one embodiment, the synchronization messages also pass through the gateway device, which transmits them to the devices 4 for measuring electrical quantities.

Advantageously, provision is made, in one embodiment, for the items of calibration and synchronization information intended for the devices 4 for measuring electrical quantities to be grouped into synchronization and calibration messages, which makes it possible to reduce the number of messages which are exchanged, and therefore to reduce the traffic and the energy consumption of the communication modules of the communicating devices.

The invention claimed is:

1. A system for calibrating voltage measurements in a system for measuring electrical quantities by means of a plurality of devices for measuring electrical quantities which are distributed in an electrical apparatus, each of the plurality of devices for measuring electrical quantities comprising:

a module for measuring voltage by means of capacitive coupling, a communication interface configured to communicate according to a communication protocol, a local clock configured to date events in a local temporal reference frame, the system further comprising a single calibration device configured to measure a voltage signal by means of contact with an electrical conductor of the electrical apparatus, the calibration device comprising a communication interface configured to communicate according to the communication protocol and an associated local clock, wherein the system further comprises a synchronization device comprising a synchronization clock configured to date an event in a reference temporal reference frame, the synchronization device configured to:

send successive synchronization messages to at least one communicating device from among the plurality of devices for measuring electrical quantities and the calibration device, wherein the successive messages comprise at least a current synchronization message and a preceding synchronization message, the current synchronization message comprising an incremental synchronization message identifier and a time instant at which the preceding message is sent, wherein each of the plurality of devices for measuring electrical quantities and the calibration device is configured to communicate with the synchronization device and to implement a mechanism for synchronizing the local clock with the synchronization clock, to date an event in the reference temporal reference frame, wherein the calibration device is configured to:

determine a first reference time instant, in the reference temporal reference frame, of a zero-crossing event of the voltage signal measured by the calibration device, transmit a calibration message comprising the first reference time instant and a measured voltage amplitude value to at least one of the plurality of devices for measuring electrical quantities, and wherein the at least one of the plurality of devices for measuring electrical quantities is configured to:

receive the calibration message from the calibration device, and extract the first reference time instant and the measured voltage amplitude, determine a second reference time instant, in the reference temporal reference frame, of a zero crossing of the voltage signal measured locally the second reference time instant corresponding to the first reference time instant, calculate a phase shift of the locally-measured voltage signal, as a function of a difference between the first reference time instant and the second reference time instant, and apply a phase and amplitude voltage calibration as a function of the received measured voltage amplitude and of the calculated phase shift.

2. The system according to claim 1, wherein each of the plurality of devices for measuring electrical quantities is configured to store a plurality of second time instants, which are expressed in the reference temporal reference frame, of zero crossing of the voltage signal measured locally.

3. The system according to claim 2, wherein, to determine the second reference time instant, each of the plurality of devices for measuring electrical quantities is configured to determine, from among the stored second time instants, the second reference time instant of zero crossing which is temporally closest to the first reference time instant.

4. The system according to claim 1, wherein the calibration device is configured to broadcast the calibration message to each of the plurality of devices for measuring electrical quantities.

5. The system according to claim 1, wherein the communication protocol is a Zigbee Green Power protocol.

6. The system according to claim 1, wherein the synchronization device is configured to send synchronization messages successively to at least one communicating device from among the plurality of devices for measuring electrical quantities and the calibration device, the successive synchronization messages comprising at least a current synchronization message and a preceding synchronization message, the current synchronization message containing an incremental synchronization message identifier and a time instant at which the preceding synchronization message is sent, each communicating device which receives the synchronization messages being configured to store a local synchronization table, storing items of information relating to time instants, in the local temporal reference frame, at which messages are sent from the synchronization device and the time instants at which the synchronization messages are sent, in the reference temporal reference frame, by the synchronization device.

7. The system according to claim 6, wherein each communicating device is configured to calculate a correspondence between the local clock of the communicating device and the reference clock using the local synchronization table.

8. The system according to claim 1, wherein the synchronization device is a gateway communication device comprising a communication interface configured to communicate according to the communication protocol.

9. A method for calibrating voltage measurements, comprising:

by means of a calibration device:

determining a first reference time instant, in a reference temporal reference frame, of a zero-crossing event of a voltage signal measured by the calibration device, transmitting a calibration message comprising the first reference time instant and a measured voltage amplitude value to at least one of a plurality of devices for measuring electrical quantities:

by means of the at least one of the plurality of devices for measuring electrical quantities:

receiving the calibration message from the calibration device, and extracting the first reference time instant and the measured voltage amplitude, determining a second reference time instant, in the reference temporal reference frame, of a zero crossing of a locally-measured voltage signal the second reference time instant corresponding to the first reference time instant, calculating a phase shift of the locally-measured voltage signal, as a function of a difference between the first reference time instant and the second reference time instant, and applying a phase and amplitude voltage calibration as a function of the received measured voltage amplitude and of the calculated phase shift, by means of a synchronization device:

sending successive synchronization messages to at least one communicating device from among the plurality of devices for measuring electrical quantities and the calibration device, wherein the successive messages comprise at least a current synchronization message and a preceding synchronization message, the current synchronization message comprising an incremental synchronization message identifier and a time instant at which the preceding message is sent.

10. The method according to claim 9, wherein the calibration device and the synchronization device are the same device, and messages sent to the at least one communicating device are grouped into calibration and synchronization messages.

* * * * *